(12) United States Patent
Lin et al.

(10) Patent No.: US 11,348,790 B2
(45) Date of Patent: May 31, 2022

(54) APPARATUS AND METHOD FOR WAFER BONDING

(71) Applicant: TAIWAN SEMICONDUCTOR MANUFACTURING COMPANY LTD., Hsinchu (TW)

(72) Inventors: Yeong-Jyh Lin, Nantou County (TW); Yeur-Luen Tu, Taichung (TW); Chin-Wei Liang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/859,129

(22) Filed: Apr. 27, 2020

(65) Prior Publication Data

US 2020/0258743 A1 Aug. 13, 2020

Related U.S. Application Data

(62) Division of application No. 14/996,981, filed on Jan. 15, 2016, now Pat. No. 10,636,661.

(51) Int. Cl.
*H01L 21/18* (2006.01)
*H01L 25/00* (2006.01)
*H01L 21/02* (2006.01)
*H01L 21/67* (2006.01)

(52) U.S. Cl.
CPC ...... *H01L 21/187* (2013.01); *H01L 21/02046* (2013.01); *H01L 21/02068* (2013.01); *H01L 21/67196* (2013.01); *H01L 25/00* (2013.01); *H01L 21/67092* (2013.01)

(58) Field of Classification Search
CPC ............. H01L 21/187; H01L 21/02068; H01L 21/02046; H01L 21/67196; H01L 21/67092; H01L 25/00
See application file for complete search history.

(56) References Cited

U.S. PATENT DOCUMENTS

| 5,433,787 | A | * | 7/1995 | Suzuki | C23C 16/455 118/719 |
| 5,486,235 | A | * | 1/1996 | Ye | B08B 7/0035 134/1.1 |
| 6,033,584 | A | * | 3/2000 | Ngo | H01L 21/31122 216/67 |
| 2005/0112877 | A1 | * | 5/2005 | Miyajima | H01L 21/76826 438/687 |
| 2009/0286382 | A1 | * | 11/2009 | Huff | H01L 24/83 438/455 |

(Continued)

*Primary Examiner* — Daniel McNally
(74) *Attorney, Agent, or Firm* — WPAT, P.C., Intellectual Property Attorneys; Anthony King

(57) ABSTRACT

An apparatus for wafer bonding includes a transfer module and a plasma module. The transfer module is configured to transfer a semiconductor wafer. The plasma module is configured to apply a first type of plasma to perform a reduction operation upon a surface of the semiconductor wafer at a temperature within a predetermined temperature range to convert metal oxides on the surface of the semiconductor wafer to metal, and apply a second type of plasma to perform a plasma operation upon the surface of the semiconductor wafer at a room temperature outside the predetermined temperature range to activate a surface of the semiconductor wafer.

20 Claims, 4 Drawing Sheets

(56) References Cited

U.S. PATENT DOCUMENTS

2012/0318432 A1* 12/2012 Nishibayashi .... H01L 21/67092
                                                              156/64
2014/0256087 A1*  9/2014 Liu ......................... H01L 24/74
                                                              438/107

* cited by examiner

APPARATUS AND METHOD FOR WAFER BONDING

PRIORITY CLAIM AND CROSS-REFERENCE

The present application is a divisional application of U.S. patent application Ser. No. 14/996,981 filed on Jan. 15, 2016, which is incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are recently developed in semiconductor packaging in which multiple semiconductor dies are stacked upon one another, such as package-on-package (PO) and system-in-package (SiP) packaging techniques. Some 3DICs are prepared by placing dies over dies on a wafer level. 3DICs provide improved integration density and other advantages, such as faster speeds and higher bandwidth, because of the decreased length of interconnects between the stacked dies, as examples. However, there are many challenges related to 3DICs.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Figure 1:
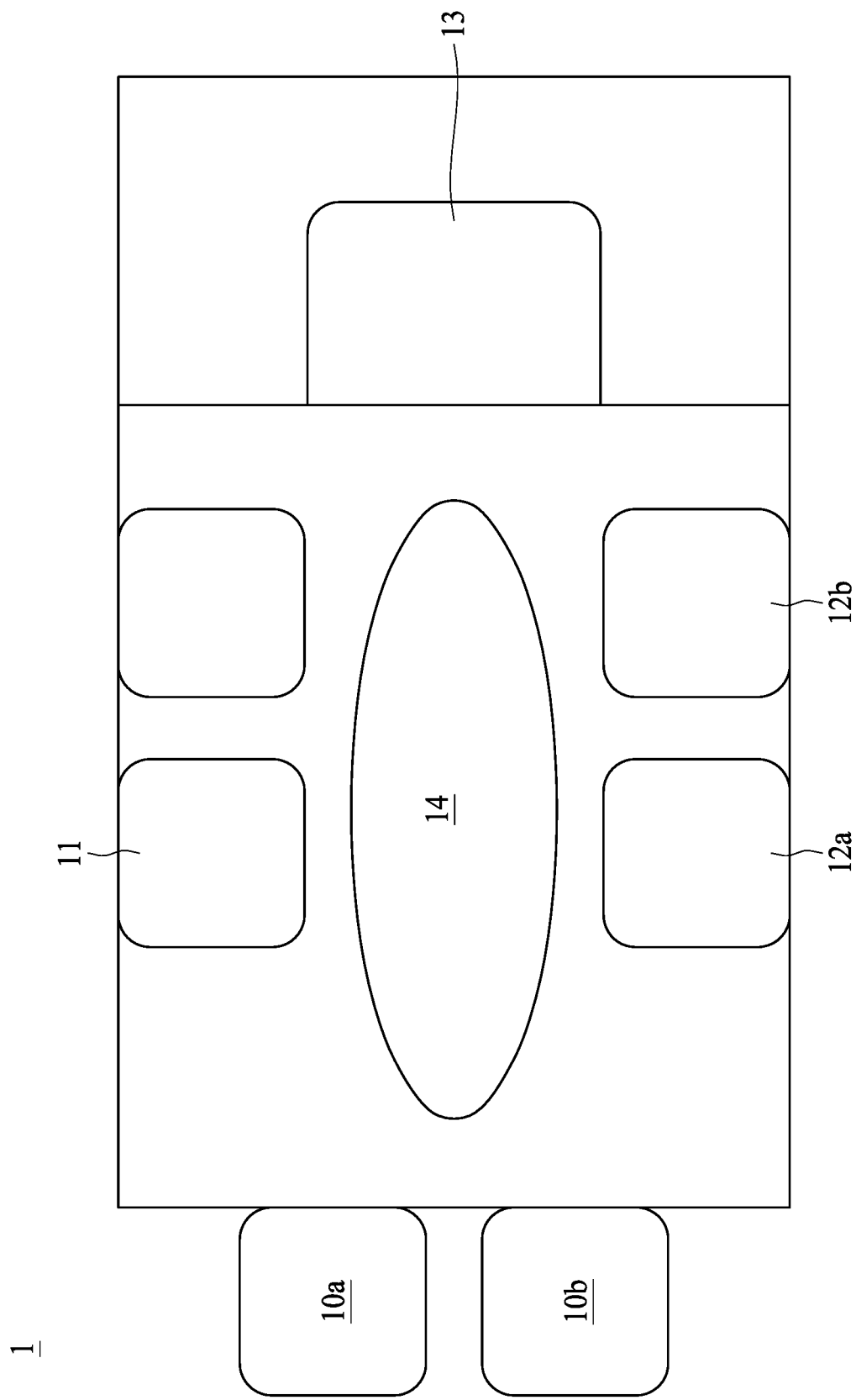
FIG. 1 is a block diagram of an apparatus for wafer bonding, in accordance with some embodiments.

FIG. 1 illustrates a block diagram of an apparatus 1 for wafer bonding in accordance with one embodiment of the present disclosure. The apparatus comprises wafer containers 10a, 10b, a plasma module 11, cleaning modules 12a, 12b, a bonding module 13 and a transfer module 14.

The wafer container 10a is used to accommodate a first set of semiconductor wafers and the wafer container 10b is used to accommodate a second set of semiconductor wafers to be vertically bonded to the first set of semiconductor wafers to form a 3DIC structure.

Each semiconductor wafer of the first set of semiconductor wafers and the second set of semiconductor wafers includes a workpiece. The workpiece includes a semiconductor substrate comprising silicon or other semiconductor materials and may be covered by an insulating layer, for example. The workpiece may include silicon oxide over single-crystal silicon, for example Compound semiconductors, GaAs, InP, Si/Ge, or SiC, as examples, may be used in place of silicon. The workpiece may include a silicon-on-insulator (SOI) or a germanium-on-insulator (GOI) substrate.

The workpiece may include a device region formed proximate a top surface of the workpiece. The device region includes active components or circuits, such as conductive features, implantation regions, resistors, capacitors and other semiconductor elements, e.g., transistors, diodes, etc. In some embodiments, the device region is formed over the workpiece in a front-end-of-line (FEOL) operation. The workpiece includes through-substrate vias (TSVs) filled with a conductive material that provide connections from a bottom surface to a top surface of the workpiece.

A metallization structure is formed over the workpiece. In some embodiments, the metallization structure is formed over the workpiece in a back-end-of-line (BEOL) operation. The metallization structure may include conductive lines, vias and conductive pads formed in a dielectric material. In some embodiments, the dielectric material is made of low dielectric constant (low-k) material(s), such as $SiO_2$. The conductive pads are contact pads or bond pads formed on a top surface of the semiconductor wafer. The conductive pads may include conductive materials typically used in BEOL operations, such as Cu, Al, W, Ti, TiN, Ta, TaN, or multiple layers or combinations thereof.

The plasma module 11 receives semiconductor wafer from the wafer container 10a or 10b by the transfer module 14. The plasma module 11 comprises a chamber and a heater. The semiconductor wafer received from the wafer container 10a or 10b is accommodated in the chamber. In some embodiments, $H_2$ or $NH_3$ plasma is applied to the surface of the semiconductor wafer in the chamber. In some embodiments, the $H_2$ or $NH_3$ plasma are applied at a flow rate in a range from about 100 sccm to about 2500 sccm. The $H_2$ or $NH_3$ plasma are applied to the surface of the semiconductor wafer to perform a reduction operation, so that metal oxides on the conductive pads located on the surface of the semiconductor wafer are converted to the pure metal. In some embodiments, the reduction operation may include the following reactions, to reduce a metal oxide comprising CuOx:

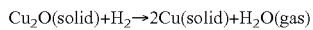

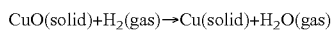

In some embodiments, the reduction operation is performed at a temperature in a range from approximately 100 Celsius (° C.) to approximately 400° C. and a pressure in a range from approximately 0.1 Torr to approximately 50 Torr. The operating temperature may be generated by the heater of the plasma module 11. In some embodiments, $Cl_2$ can be applied to the chamber of the plasma module 11 at the temperature in a range from approximately 100° C. to approximately 400° C. to clean sidewall of the chamber, which would prevent the sidewall of the chamber from etching by Cu.

Thereafter, the plasma module 11 is configured to perform a plasma operation. The surface of the semiconductor wafer is treated to promote bonding integrity through the plasma module 11. The plasma module 11 is used to generate plasma to active the dielectric material on the surface of the semiconductor wafer. During plasma operation, the top surface of semiconductor wafer is exposed to the plasma. In some embodiments. Si—O bonds are formed on the dielectric material of the semiconductor wafer after plasma operation. In some embodiments, $N_2$, $N_2H_2$ or Ar is used in the plasma operation. In some embodiments, the plasma operation includes using Ar in a range from about 0% to about 100% and using $H_2$ in a range from about 0% to about 20% (in volume and at room temperature). In some embodiments, the reduction operation can be performed after the plasma operation based on the requirement.

After the reduction operation and the plasma operation, the semiconductor wafer is transferred to the clean module 12a or 12b by the transfer module 14. The clean module 12a or 12b is used to perform the cleaning operation. The cleaning operation may comprise exposing the semiconductor wafer to deionized (DI) $H_2O$, $NH_4OH$, diluted hydrofluoric acid (DHF) (e.g., at a concentration of less than about 1% HF acid), or other acids. The cleaning operation may be performed by using a brush, a mega-sonic procedure, a spin operation, an infrared (IR) lamp, or a combination thereof. Alternatively, the cleaning operation may comprise other types of cleaning operations. In some embodiments, the cleaning operation enhances a density of a hydroxy group disposed on the surfaces of the semiconductor wafer, e.g., on the top surface of the conductive pads of the semiconductor wafer. Enhancing the density of the hydroxy group on the conductive pads of the semiconductor wafer advantageously increases bonding strength and reduces the anneal temperature required for the bonding operation, for example. In some embodiments, the cleaning operation may be used to remove the remaining metal oxide on the conductive pads located on the surface of the semiconductor wafer.

The reduction operation, the plasma operation and the cleaning operation are adapted to prepare the surface of the semiconductor wafer for bonding to another semiconductor wafer. By doing so, the surface of the semiconductor wafer is as clean as possible so that a high quality hybrid bond is formed between two or more semiconductor wafers. The reduction operation, the plasma operation and the cleaning operation assist in the hybrid bonding of two or more semiconductor wafers, advantageously allowing the use of lower pressures and temperatures in a subsequent bonding operation.

After the cleaning operation, the semiconductor wafer is transferred to the bonding module 13. The bonding module 13 is used to perform an alignment operation and a bonding operation to bond the semiconductor wafer to another semiconductor wafer. During the alignment operation, the bonding of the semiconductor wafers is achieved by aligning the conductive pads or alignment mark on a semiconductor wafer with the corresponding conductive pads or alignment mark on another semiconductor wafer. The alignment of the semiconductor wafers may be achieved by using optical sensing, as an example. The bonding operation is by coupling the conductive pads of the semiconductor wafer to the corresponding conductive pads of another semiconductor wafer. Both of the semiconductor wafers to be bonded have been processed by the reduction operation, the plasma operation and the cleaning operation mentioned above.

After the bonding operation of the semiconductor wafers, the bonded wafer may be transferred to an annealing module (not shown in the drawing). In some embodiments, the annealing module may be a furnace or an oven. The anneal operation is performed to bond the semiconductor wafers together by applying pressure or heat. The pressure applied may comprise a pressure of less than about 30 MPa, and the heat applied may comprise an anneal operation at a temperature of about 100° C. to 500° C., as examples, although other amounts of pressure and heat may be used for the anneal operation. In some embodiment, the grain size of the Cu of the conductive pads may comprise about 0.1 μm to 5 μm after the anneal operation, with a bond strength larger than about 1.0 $J/m^2$. The bonding operation or the anneal operation may be performed in a $N_2$ environment, an Ar environment, a He environment, an (about 4 to 10% $H_2$)/ (about 90 to 96% inert gas or $N_2$) environment, an inert-mixing gas environment, combinations thereof, or other types of environments. The ambient environment in the bonding module 13 or the annealing module contains a minimal amount of or no amount of $O_2$, to prevent the oxidation of the conductive pads before or during the bonding operation or the anneal operation.

After the bonding operation and the anneal operation, bonds are formed between the dielectric materials of the semiconductor wafers. In some embodiments, the annealing module is further configured to perform a fusion operation that forms the non-metal-to-non-metal bonds.

Figure 2:
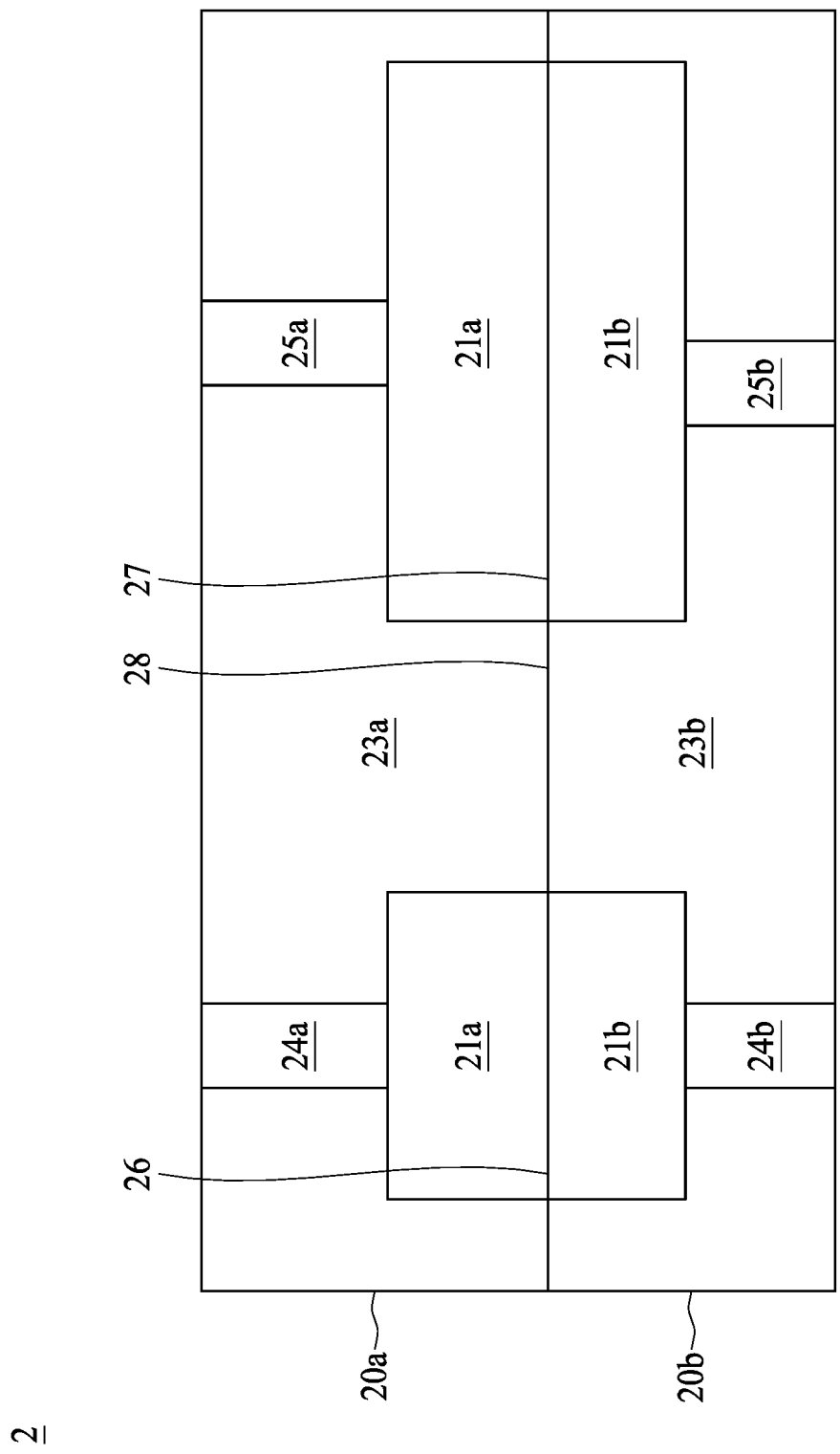
FIG. 2 is a cross-sectional view of a semiconductor structure, in accordance with some embodiments.

FIG. 2 illustrates a portion of a bonded semiconductor wafer structure 2 in accordance with some embodiments of the present disclosure. The bonded semiconductor wafer structure 2 comprises two semiconductor wafers 20a and 20b that are bonded together using the apparatus and the bonding operation mentioned in FIG. 1.

The semiconductor wafer 20a comprises conductive pads 21a and 22a, dielectric material 23a, and through vias 24a and 25a. The conductive pads 21a, 22a are connected to other components or circuits integrated in the semiconductor wafer 20a (such as conductive features, implantation regions, resistors, capacitors and other semiconductor elements, e.g., transistors, diodes) by the through vias 24a, 25a respectively.

The semiconductor wafer 20b comprises conductive pads 21b and 22b, dielectric material 23b, and through vias 24b and 25b. The conductive pads 21b, 22b are connected to other components or circuits integrated in the semiconductor wafer 20b (such as conductive features, implantation regions, resistors, capacitors and other semiconductor elements, e.g., transistors, diodes) by the through vias 24b, 25b respectively. The conductive pads 21a, 22a of the semiconductor wafer 20a are substantially aligned with the corresponding conductive pads 21b, 22b of the semiconductor wafer 20b.

As shown in FIG. 2, after the anneal operation, bonds 28 are formed between the dielectric material 23a of the semiconductor wafer 20a and the dielectric material 23b of the semiconductor wafer 20b. Bonds 26, 27 are also formed between the conductive pads 21a and 22a of the semiconductor wafer 20a and the conductive pads 21b and 22b of the semiconductor wafer 20b, respectively. Bonds 28 comprise non-metal-to-non-metal bonds, and bonds 26, 27 comprise metal-to-metal bonds. Since two different types of bonds (metal-to-metal bonds 26, 27 and non-metal-to-non-metal bonds 28) are formed using a single bonding operation, rather than forming only one type of bond, this bonding operation can be referred to a hybrid bonding operation.

After manufacturing a single semiconductor, the semiconductor wafer may be placed in a fabrication facility in storage or on a shelf for a period of time. In some embodiment, because Cu oxidizes easily, during the storage period, an oxide material may be formed on top surfaces of the conductive pads of the semiconductor wafer, depending on the manufacturing environment. The oxide material may comprise copper oxide (CuOx) for example, by exposure of the Cu conductive pads to oxygen in the ambient air. The oxide material may comprise other materials, depending on the type of material of the conductive pads. Removal of the oxide material from the top surfaces of the conductive pads is important to achieve a high quality hybrid bond to another semiconductor wafer, to avoid high resistance connections between the semiconductor wafers.

In accordance with some embodiments of the present disclosure, each semiconductor wafer is processed by the plasma module 11 and the clean modules 12a, 12b shown in FIG. 1, and thus the oxide material would be removed during the reduction operation performed by the plasma module 11 and the cleaning operation performed by the clean modules 12a, 12b. Therefore, the resistance between the conductive pads 21a, 21b, 22a, 22b of two bonded semiconductor wafers 20a, 20b can be reduced, which would in turn to improve the bonding quality and performance of the bonded semiconductor wafer structure 2.

Figure 3:
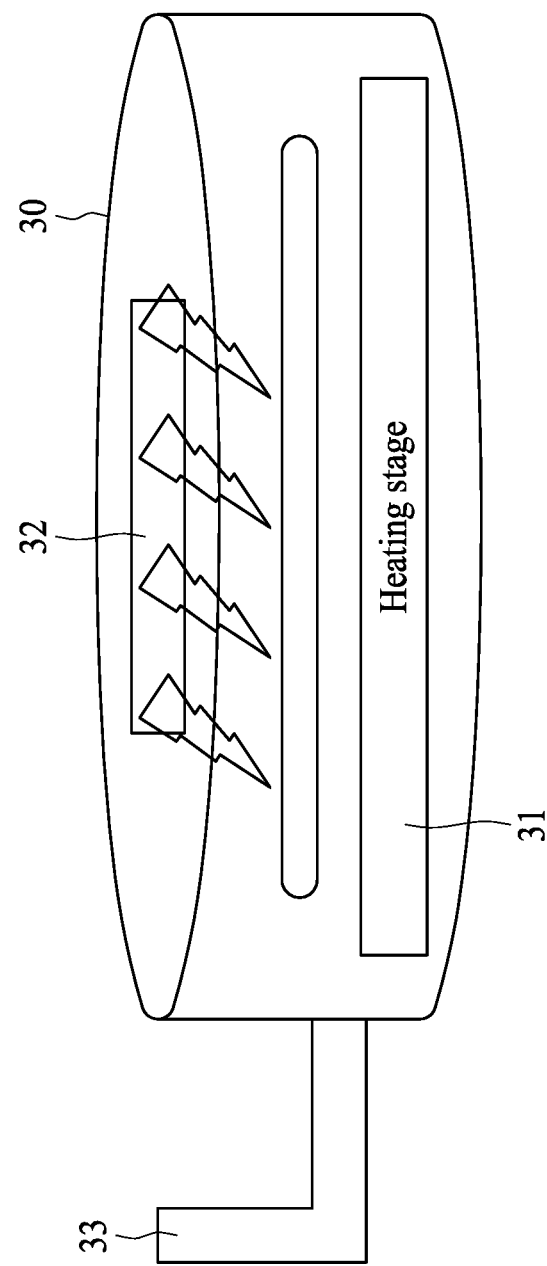
FIG. 3 is structure of a plasma module, in accordance with some embodiments.

FIG. 3 illustrates the detail structure of the plasma module in FIG. 1 in accordance with some embodiments of the present disclosure. The plasma module 3 shown in FIG. 3 comprises a chamber 30, a heating stage 31, a power source 32 and a gas input 33.

The plasma module 3 receives the semiconductor wafer and accommodates the received semiconductor wafer in the chamber 30. The heating stage 31 is used to control the temperature of the semiconductor wafer in the chamber 30. In some embodiments, the temperature in the heating stage can be controlled in a range from approximately 100° C. to approximately 400° C.

The gas can be inputted to the chamber 30 and applied to the semiconductor wafer accommodated in the chamber 30 through the input 33. In some embodiments, $H_2$, $N_2$, $NH_3$, $N_2H_2$ or Ar is applied to the semiconductor wafer in the chamber 30 through the input 33. In some embodiments, $H_2$, $N_2$, $NH_3$, $N_2H_2$ or Ar may be applied at a flow rate in a range from about 100 sccm to about 2500 sccm.

The power source 32 is used to ionize the gas applied to the chamber 30, so that the gas in the chamber 30 would be converted to the plasma. In some embodiments, the power source 32 can generate a radio frequency (RF) power of about 300 W.

In some embodiments, when the plasma module 3 receives the semiconductor wafer from the wafer container 10a or 10b shown in 1, $H_2$ or $NH_3$ would be applied to the chamber 30 through the input 33 at a flow rate from about 100 sccm to about 2500 sccm. The heating stage is configured to control the temperature of the wafer at a temperature in a range from about 100° C. to about 400° C. The power source 32 is configured to generate a RF power of about 300 W to convert $H_2$ or $NH_3$ to $H_2$ or $NH_3$ plasma. The $H_2$ or $NH_3$ plasma is applied to the surface of the semiconductor wafer to perform a reduction operation, so that metal oxides on the conductive pads located on the surface of the semiconductor wafer are converted to the pure metal. In some embodiments, the reduction operation may include the following reactions, to reduce a metal oxide comprising CuOx:

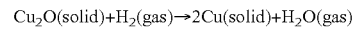

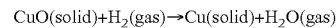

In some embodiment, the reduction operation is performed at a temperature in a range from approximately 100° C. to approximately 400° C. and a pressure in a range from approximately 0.1 Torr to approximately 50 Torr. In some embodiments, $Cl_2$ can be applied to the chamber 30 of the plasma module 3 at the temperature in a range from approximately 100° C. to approximately 400° C. to clean sidewall of the chamber 30, which would prevent the sidewall of the chamber 30 from deposition by Cu or CuOx.

Thereafter, the plasma module 3 is configured to perform a plasma operation. In some embodiments, $N_2$, $N_2H_2$ or Ar is applied to the chamber 30 through the input 33. In some embodiments, the plasma operation includes using Ar in a range from about 80% to about 100% and using $H_2$ in a range from about 0% to about 20% (in volume and at room temperature). The power source 32 is configured to generate a RF power to convert the gas applied to the chamber 30 to plasma. The surface of the semiconductor wafer is treated to assist bonding by the plasma module 3. The plasma module 3 is used to generate plasma to active the dielectric material on the surface of the semiconductor wafer. During plasma operation, the top surface of semiconductor wafer is exposed to the plasma. In some embodiments, Si—O bonds are formed at the top surface of the dielectric material after plasma operation. In some embodiments, the reduction operation and the plasma operation can be interchanged based on the requirement.

Figure 4:
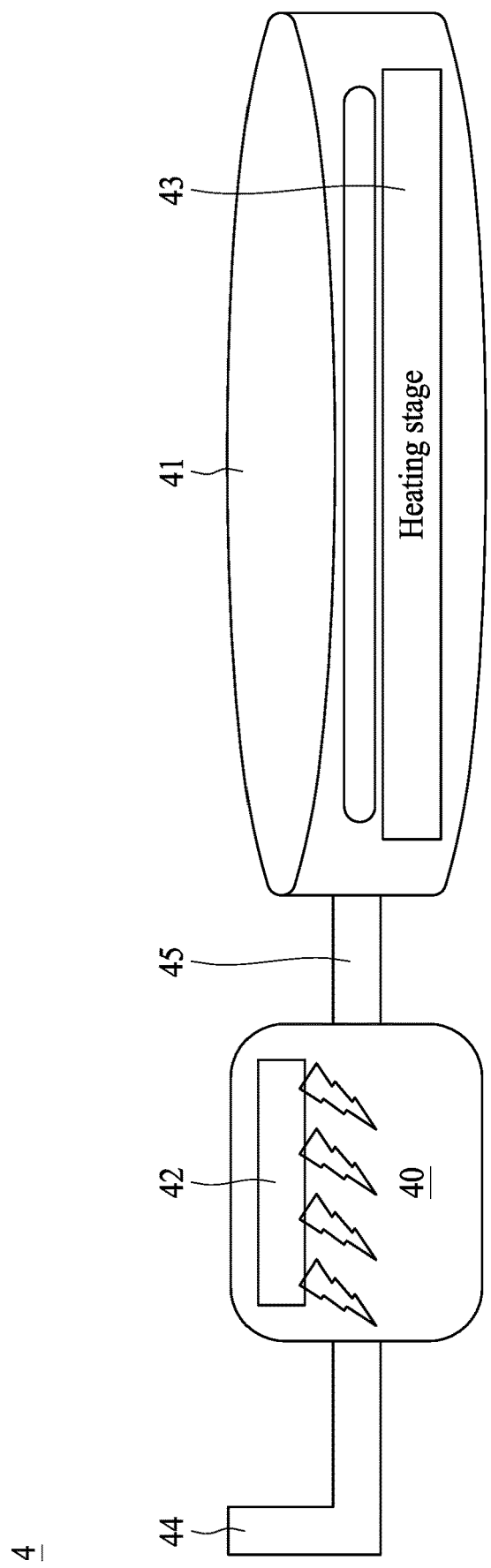
FIG. 4 is structure of a plasma module, in accordance with some embodiments.

FIG. 4 illustrates the detail structure of the plasma module in FIG. 1 in accordance with some embodiments of the present disclosure. The plasma module 4 shown in FIG. 4 comprises a first chamber 40, a second chamber 41, a heating stage 43, a power source 42, a first input 44 and a second input 45.

The plasma module 4 receives the semiconductor wafer and accommodates the received semiconductor wafer in the second chamber 41. The heating stage 43 is used to control the temperature of the semiconductor wafer in the second chamber 41. In some embodiments, the temperature in the heating stage 43 can be controlled in a range from approximately 100° C. to approximately 400° C.

The gas can be inputted to the first chamber 40 through the input 44. In some embodiments, $H_2$, $N_2$, $NH_3$, $N_2H_2$ or Ar is applied to the first chamber 40 through the input 44. In some embodiments, $H_7$, $N_2$, $NH_3$, $N_2H_2$ or Ar may be applied at a flow rate in a range from about 100 sccm to about 2500 sccm.

The power source 42 is used to ionize the gas applied to the first chamber 40 so that the gas in the first chamber 40 would be converted to the plasma. In some embodiments, the power source 42 can generate a RF power of about 300W.

In some embodiments, when the plasma module 4 receives the semiconductor wafer from the wafer container 10a or 10b shown in FIG. 1, $H_2$ or $NH_3$ would be applied to the first chamber 40 through the input 44 at a flow rate from about 100 sccm to about 2500 sccm. The power source 32 is configured to generate a RF power of about 300 W to convert $H_2$ or $NH_3$ to $H_2$ or $NH_3$ plasma. The $H_2$ or $NH_3$ plasma is then transferred to the second chamber 41 through the second input 45.

The heating stage 43 in the second chamber 41 is configured to control the temperature of semiconductor wafer in the second chamber 41 at a temperature in a range from about 100° C. to about 400° C. The $H_2$ or $NH_3$ plasma received from the first chamber 40 is applied to the surface of the semiconductor wafer to perform a reduction operation, so that metal oxides on the conductive pads located on the surface of the semiconductor wafer are converted to the pure metal. In some embodiments, the reduction operation may include the following reactions, to reduce a metal oxide comprising CuOx:

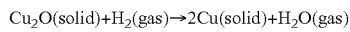

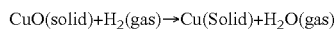

In some embodiment, the reduction operation is performed at a temperature in a range from approximately 100° C. to approximately 400° C. and a pressure in a range from approximately 0.1 Torr to approximately 50 Torr. In some embodiments, $Cl_2$ can be applied to the second chamber 41 of the plasma module 4 at the temperature in a range from approximately 100° C. to approximately 400° C. to clean sidewall of the second chamber 41, which would prevent the sidewall of the second chamber 41 from deposition by Cu.

Thereafter, the plasma module 4 is configured to perform a plasma operation. In some embodiments, $N_2$, $N_2H_2$ or Ar is applied to the first chamber 40 through the input 44. In some embodiments, the plasma operation includes using Ar in a range from about 80% to about 100% and using $H_2$ in a range from about 0% to about 20% (in volume and at room temperature). The power source 42 is configured to generate a RF power to convert the gas applied to the first chamber 40 to plasma. The plasma is then transferred to the second chamber 41 through the input 45.

The surface of the semiconductor wafer located within the second chamber 41 is treated to assist bonding by the plasma module 4. The plasma received from the first chamber 40 is used to active the dielectric material on the surface of the semiconductor wafer. During plasma operation, the top surface of semiconductor wafer is exposed to the plasma. In some embodiments, Si—O bonds are formed at the top surface of the dielectric material after plasma operation. In some embodiments, the reduction operation and the plasma operation can be interchanged based on the requirement.

In order to ionize the gas, the RF power generated by the power source should be very strong. If the power source and the semiconductor are accommodated in a same chamber (e.g., FIG. 3), such strong RF power may cause damage on the semiconductor wafer. In accordance with the plasma module shown in FIG. 4, the gas is converted to the plasma in the first chamber and then the plasma is applied to the semiconductor wafer in the second chamber. Therefore, the semiconductor wafer can be protected from damage by separating the semiconductor wafer and the plasma generation source in different chambers.

In view of the above, a preferred aspect of the present disclosure is to provide an apparatus to achieve a high quality hybrid bond between two semiconductor wafers by removing oxide material from the conductive pads of the semiconductor wafers to be hybrid bonded. Therefore, the resistance of the conductive pads of the semiconductor wafers to be bonded would be reduced, which would in turn to improve the bonding quality and the performance of the bonded semiconductor wafer.

In accordance with embodiments of the present disclosure, an apparatus for wafer bonding is provided. The apparatus comprises a transfer module and a plasma module. The transfer module is configured to transfer a semiconductor wafer. The plasma module is configured to perform a plasma operation and a reduction operation to a surface of the semiconductor wafer to convert metal oxides on the surface of the semiconductor wafer to the metal.

In accordance with an embodiment, a plasma apparatus for wafer bonding is provided. The plasma apparatus comprises a first chamber and a heater. The first chamber is used to accommodate a semiconductor wafer. The heater is used to control a temperature of the semiconductor wafer in the first chamber. The plasma apparatus is configured to convert metal oxides on a surface of the semiconductor wafer to the metal.

In accordance with another embodiment, a method for wafer bonding is provided. The method comprises (a) applying H2 or NH3 plasma on conductive pads of a semiconductor wafer to convert metal oxides on the conductive pads of the semiconductor wafer to metal; (b) activating a surface of the semiconductor wafer; and (c) coupling the conductive pads of the semiconductor wafer to the corresponding conductive pads of another semiconductor wafer.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:

1. An apparatus for wafer bonding, comprising:
a transfer module configured to transfer a semiconductor wafer; and
a plasma module configured to apply different types of plasma to perform different types of operations, the different types of plasma comprising a first type of plasma, a second type of plasma and a third type of plasma, the plasma module comprising:
a first chamber, configured to accommodate the semiconductor wafer; and
a heating stage, located in the first chamber, the heating stage configured to selectively control a temperature, at which an operation is performed in the first chamber, to fall within a predetermined temperature range,
wherein when the first type of plasma is applied to the first chamber to perform a reduction operation upon the surface of the semiconductor wafer to convert metal oxides on the surface of the semiconductor wafer to metal, the heating stage located in the first chamber is configured to control a temperature at which the reduction operation is performed to fall within the predetermined temperature range;
when the second type of plasma comprising $Cl_2$ plasma is applied to the first chamber to clean a sidewall of the first chamber, the heating stage is configured to control a temperature, at which the second type of plasma is applied to the first chamber for cleaning the sidewall, to fall within the predetermined temperature range and reach the temperature at which the reduction operation is performed; when the third type of plasma is applied to the first chamber to perform a plasma operation upon the surface of the semiconductor wafer to activate a surface of the semiconductor wafer, the plasma operation is performed at a room temperature outside the predetermined temperature range.

2. The apparatus of claim 1, wherein the predetermined temperature range is from approximately 100 Celsius (° C.) to approximately 400° C.

3. The apparatus of claim 1, wherein the plasma module is configured to perform the reduction operation under a pressure in a range from approximately 0.1 Torr to approximately 50 Torr.

4. The apparatus of claim 1, wherein the first type of plasma comprises at least one of $H_2$ plasma and $NH_3$ plasma.

5. The apparatus of claim 1, wherein the third type of plasma comprises at least one of $N_2$ plasma, $N_2H_2$ plasma and Ar plasma.

6. The apparatus of claim 1, wherein the plasma module further comprises a power source located in the first chamber, and the power source is configured to ionize the first type of plasma.

7. The apparatus of claim 1, wherein the plasma module further comprises:
   a power source, configured to ionize the first type of plasma; and
   a second chamber, wherein the power source is located in the second chamber, and the ionized first type of plasma is transferred from the second chamber to the first chamber and applied to the semiconductor wafer.

8. The apparatus of claim 1, further comprising at least one wafer container to accommodate the semiconductor wafers to be hybrid bonded.

9. The apparatus of claim 1, further comprising a clean module configured to clean the surface of the semiconductor wafer to form hydroxide on the surface of the semiconductor wafer.

10. The apparatus of claim 1, further comprising a bonding module configured to physically contact two wafers and bond by non-metal-to-non-metal region.

11. An apparatus for wafer bonding, comprising:
    a transfer module configured to transfer a semiconductor wafer to be bonded; and
    a plasma module, configured to receive the semiconductor transferred by the transfer module, and apply heat to the semiconductor wafer to convert metal oxides on a surface of the semiconductor wafer to metal, the plasma module comprising:
      a first chamber for accommodating the semiconductor wafer; and
      a heater, located in the first chamber, the heater configured to selectively control a temperature, at which an operation is performed upon the semiconductor wafer utilizing plasma comprising a first type of plasma and a second type of plasma, to fall within a predetermined temperature range according to whether the first type of plasma is utilized to perform the operation;
    wherein when the first type of plasma comprising $NH_3$ plasma is applied to the first chamber to perform the operation to convert metal oxides on the surface of the semiconductor wafer to metal, the heater located in the first chamber is configured to control the temperature to rise above a room temperature and fall within the predetermined temperature range; when the second type of plasma different from the first type of plasma is applied to the first chamber to perform the operation to activate dielectric material on the surface of the semiconductor wafer, the operation is performed at the room temperature outside the predetermined temperature range.

12. The apparatus of claim 11, further comprising:
    a clean module configured to, after the semiconductor wafer in the plasma module is transferred to the clean module by the transfer module, clean the surface of the semiconductor wafer to form hydroxide on the surface of the semiconductor wafer.

13. The apparatus of claim 12, further comprising:
    a bonding module configured to, after the semiconductor wafer in the clean module is transferred to the bonding module by the transfer module, physically contact the semiconductor wafer and another semiconductor wafer, and bond a non-metal region of the semiconductor wafer to a non-metal region of the another semiconductor wafer.

14. The apparatus of claim 11, wherein the predetermined temperature range is from approximately 100° C. to approximately 400° C.

15. The apparatus of claim 11, wherein the metal oxides are converted to the metal under a pressure in a range from approximately 0.1 Torr to approximately 50 Torr.

16. The apparatus of claim 11, wherein the plasma module further comprises:
    a power source located in the first chamber, the power source configured to generate an RF power to convert gas inputted to the first chamber to the plasma.

17. The apparatus of claim 11, wherein the plasma module further comprises:
    a second chamber configured to transfer the plasma to the first chamber; and
    a power source, located in the second chamber, the power source configured to generate an RF power to convert gas inputted to the second chamber to the plasma.

18. An apparatus for wafer bonding, comprising:
    a transfer module configured to transfer a semiconductor wafer to be bonded; and
    a plasma module, configured to receive the semiconductor transferred by the transfer module, the plasma module comprising:
      a gas input, arranged to receive a first type of gas, a second type of gas and a third type of gas;
      a power source, configured to ionize the first type of gas to generate a first type of plasma, ionize the second type of gas to generate a second type of plasma, and ionize a third type of gas to generate a third type of plasma;
      a chamber, configured to accommodate the semiconductor wafer, and receive the first type of plasma, the second type of plasma and the third type of plasma to perform different types of operations;
      a heater, located in the chamber, the heater being configured to selectively control a temperature, at which an operation is performed in the chamber, to fall within a predetermined temperature range according to whether one of the first type of plasma and the second type of plasma is utilized to perform the operation;
    wherein when the first type of plasma is utilized to perform the operation to convert metal oxides on the surface of the semiconductor wafer to metal, the heater located in the chamber is configured to control the temperature to reach a predetermined temperature falling within the predetermined temperature range; when the second type of plasma comprising $Cl_2$ plasma is utilized to perform the operation to clean a sidewall of the chamber, the heater is configured to control the temperature to reach the predetermined temperature at which the operation is performed utilizing the first type of plasma; when the third type of plasma is utilized to perform the operation to activate dielectric material on the surface of the semiconductor wafer, the operation is performed at a room temperature outside the predetermined temperature range.

19. The apparatus of claim 18, wherein the first type of plasma comprising $NH_3$ plasma, and the predetermined temperature at which the operation is performed utilizing the first type of plasma is higher than the room temperature.

20. The apparatus of claim 18, further comprising a bonding module configured to bond a non-metal region of the semiconductor wafer to a non-metal region of the another semiconductor wafer.

* * * * *